United States Patent
Yonemura et al.

(10) Patent No.: US 9,503,656 B2
(45) Date of Patent: Nov. 22, 2016

(54) SOLID STATE IMAGING DEVICE AND IMAGE ACQUISITION METHOD USING SOLID STATE IMAGING ELEMENTS HAVING A PN JUNCTION

(71) Applicant: Seiko Epson Corporation, Tokyo (JP)

(72) Inventors: Takayuki Yonemura, Suwa (JP);
Yasuaki Hamada, Chino (JP);
Yoshihiko Yokoyama, Chino (JP)

(73) Assignee: Seiko Epson Corporation (JP)

( * ) Notice: Subject to any disclaimer, the term of this patent is extended or adjusted under 35 U.S.C. 154(b) by 12 days.

(21) Appl. No.: 14/567,315

(22) Filed: Dec. 11, 2014

(65) Prior Publication Data

US 2015/0172556 A1    Jun. 18, 2015

(30) Foreign Application Priority Data

Dec. 11, 2013 (JP) .................................. 2013-256530
Dec. 11, 2014 (JP) .................................. 2014-250506

(51) Int. Cl.
*H04N 5/243* (2006.01)
*H04N 5/378* (2011.01)
(Continued)

(52) U.S. Cl.
CPC .......... *H04N 5/243* (2013.01); *H01L 27/1461* (2013.01); *H01L 27/14643* (2013.01); *H04N 5/2351* (2013.01); *H04N 5/2355* (2013.01); *H04N 5/355* (2013.01); *H04N 5/374* (2013.01); *H04N 5/378* (2013.01)

(58) Field of Classification Search
CPC .................... H04N 5/235; H04N 5/378; H04N 5/243; H01L 27/146
See application file for complete search history.

(56) References Cited

U.S. PATENT DOCUMENTS 4,051,465 A * 9/1977 Brody .................. G02F 1/1358
                                                    136/254
4,126,901 A * 11/1978 Brody .................. G02F 1/0533
                                                    359/242

(Continued)

FOREIGN PATENT DOCUMENTS

JP          04-298175 A     10/1992
JP          2000-125209 A    4/2000
(Continued)

*Primary Examiner* — Abdelaaziz Tissire
(74) *Attorney, Agent, or Firm* — Harness, Dickey & Pierce, P.L.C.

(57) ABSTRACT

A solid state imaging device includes: solid state imaging elements having a first electrode, a ferroelectric layer, and a transparent second electrode laminated together, and a PN junction between the ferroelectric layer and the first or second electrode; a controller acquiring brightness information of an imaging target, and determining whether each solid state imaging element is set to operate in a high or low sensitivity mode based on the brightness information; and a circuit applying a voltage to the solid state imaging element based on the determination, and setting the solid state imaging element to operate in the high or low sensitivity mode, in which a photovoltaic current from the solid state imaging element which is set to operate in the high or low sensitivity mode is detected, and an image is acquired based on the detection result.

10 Claims, 10 Drawing Sheets

(51) Int. Cl.
  *H04N 5/374*     (2011.01)
  *H04N 5/235*     (2006.01)
  *H04N 5/355*     (2011.01)
  *H01L 27/146*    (2006.01)

(56) References Cited

U.S. PATENT DOCUMENTS

| | | | |
|---|---|---|---|
| 5,458,986 A * | 10/1995 | Wilber | C04B 35/62218 365/117 |
| 6,831,692 B1 | 12/2004 | Oda | |
| 2006/0119726 A1 | 6/2006 | Oda et al. | |
| 2007/0152133 A1 * | 7/2007 | He | H01L 27/14601 250/208.1 |
| 2008/0291303 A1 * | 11/2008 | Onozawa | G02B 5/1885 348/294 |
| 2009/0153716 A1 * | 6/2009 | Ota | H01L 27/14603 348/308 |
| 2010/0044822 A1 * | 2/2010 | Longoni | H01L 27/14647 257/446 |
| 2010/0165167 A1 | 7/2010 | Sugiyama et al. | |
| 2011/0102517 A1 | 5/2011 | Yonemura et al. | |
| 2011/0149633 A1 * | 6/2011 | Ahn | G11C 11/22 365/145 |
| 2011/0187912 A1 * | 8/2011 | Arayashiki | H01L 27/14629 348/308 |
| 2011/0221831 A1 | 9/2011 | Yonemura et al. | |
| 2012/0281451 A1 * | 11/2012 | Jiang | G11C 11/22 365/145 |
| 2013/0063624 A1 * | 3/2013 | Lin | H01L 27/14645 348/231.99 |
| 2014/0251436 A1 * | 9/2014 | Hamada | H01L 31/0328 136/265 |
| 2014/0264028 A1 * | 9/2014 | Hamada | G01J 5/34 250/338.2 |
| 2014/0284480 A1 * | 9/2014 | Yonemura | G01J 5/046 250/338.1 |
| 2015/0084151 A1 * | 3/2015 | Yonemura | H01L 31/032 257/461 |
| 2015/0155418 A1 * | 6/2015 | Hamada | H01L 31/036 136/265 |

FOREIGN PATENT DOCUMENTS

| | | |
|---|---|---|
| JP | 4018820 B2 | 12/2007 |
| JP | 2011-093295 A | 5/2011 |
| JP | 4738907 B2 | 8/2011 |
| JP | 2011-211144 A | 10/2011 |
| JP | 5258551 B2 | 8/2013 |

* cited by examiner

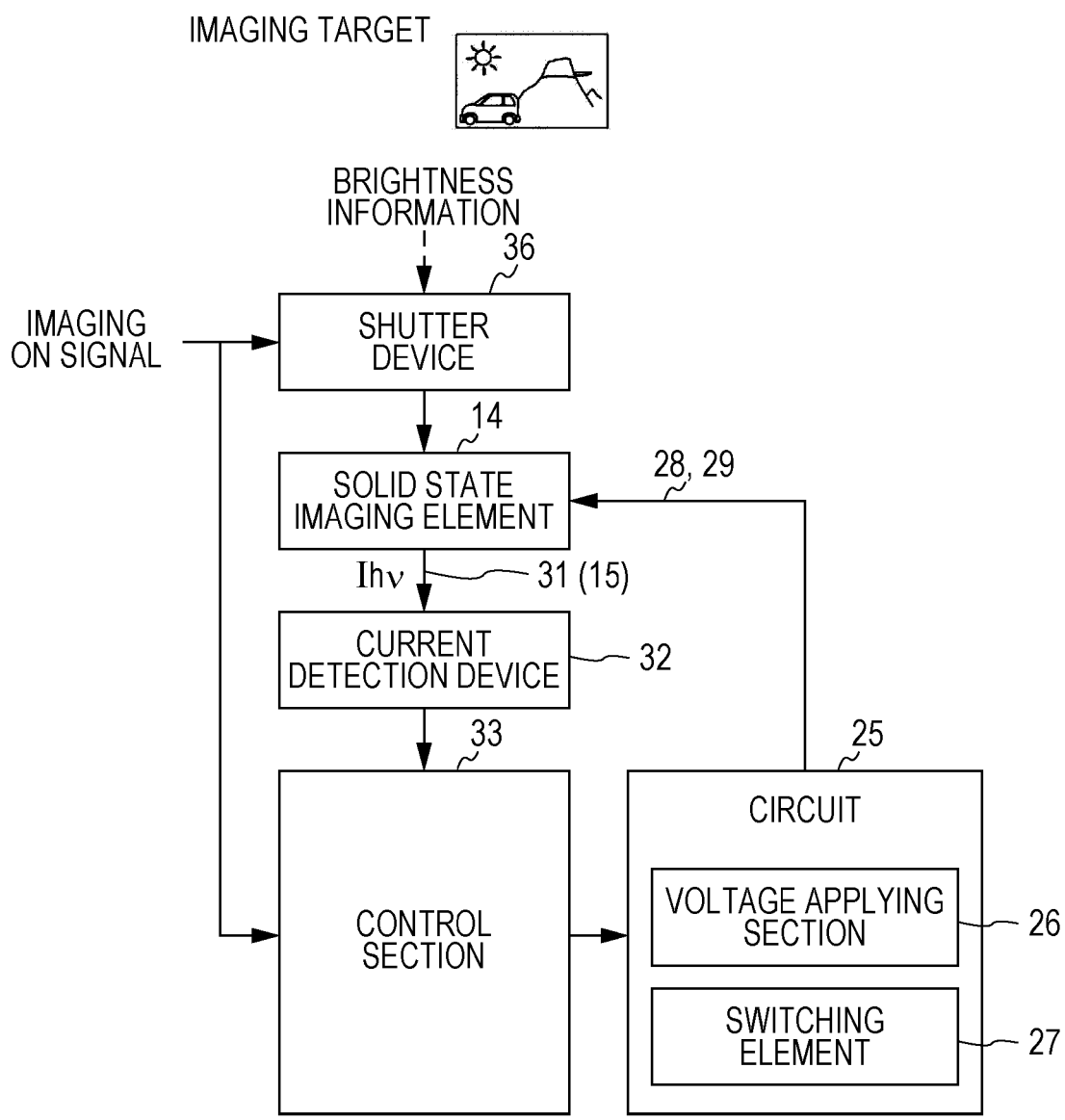

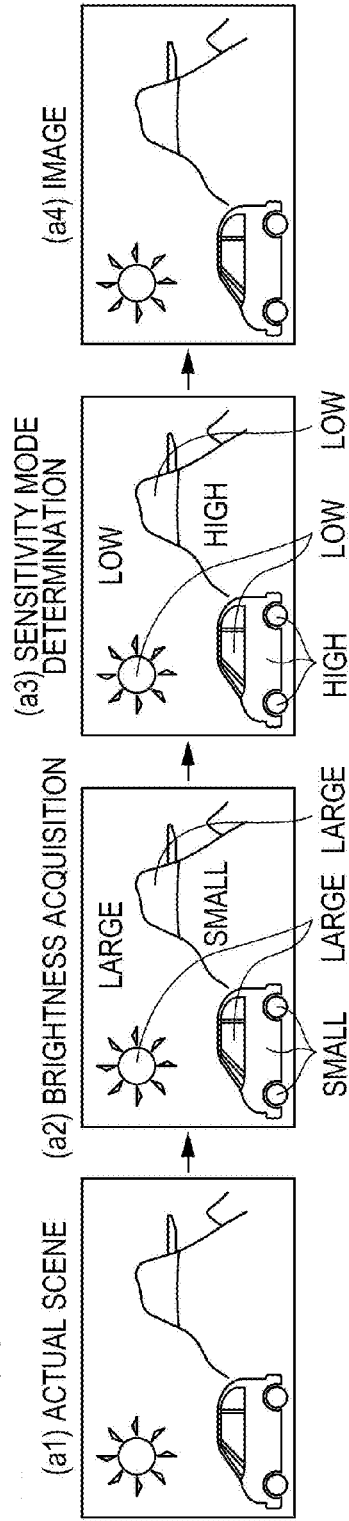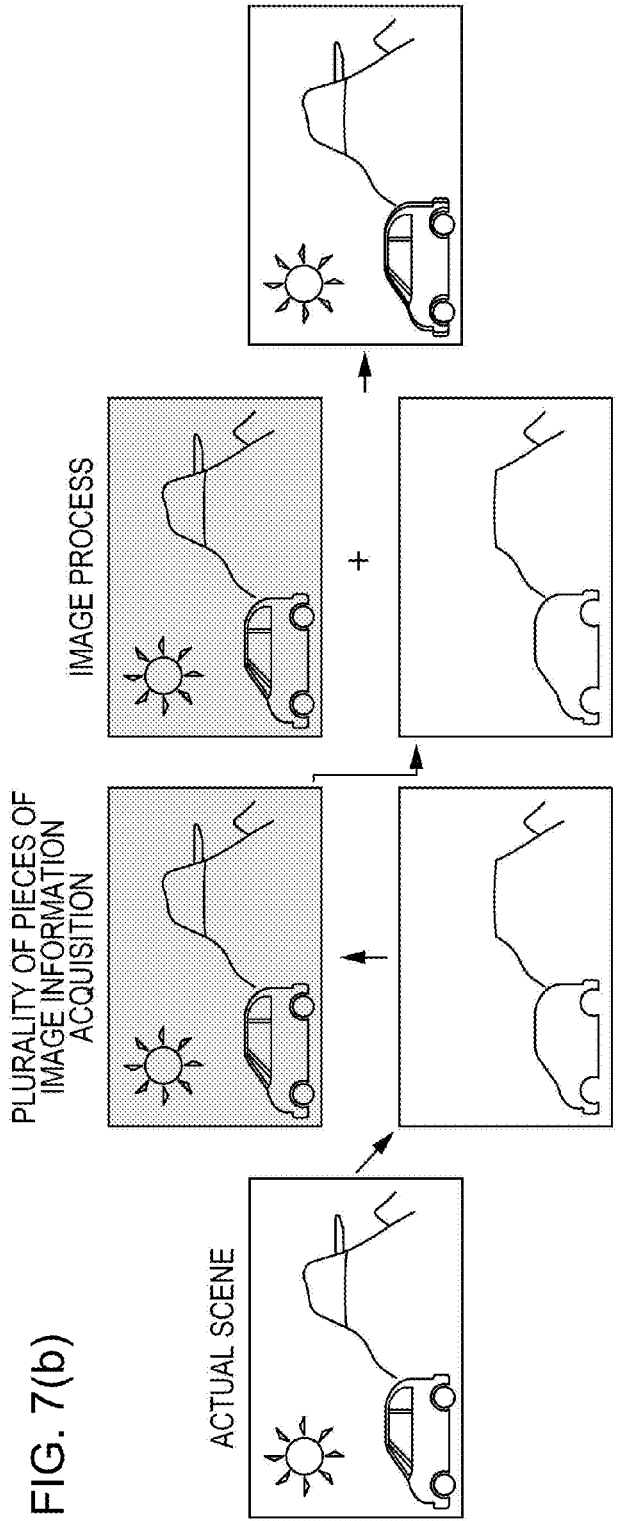

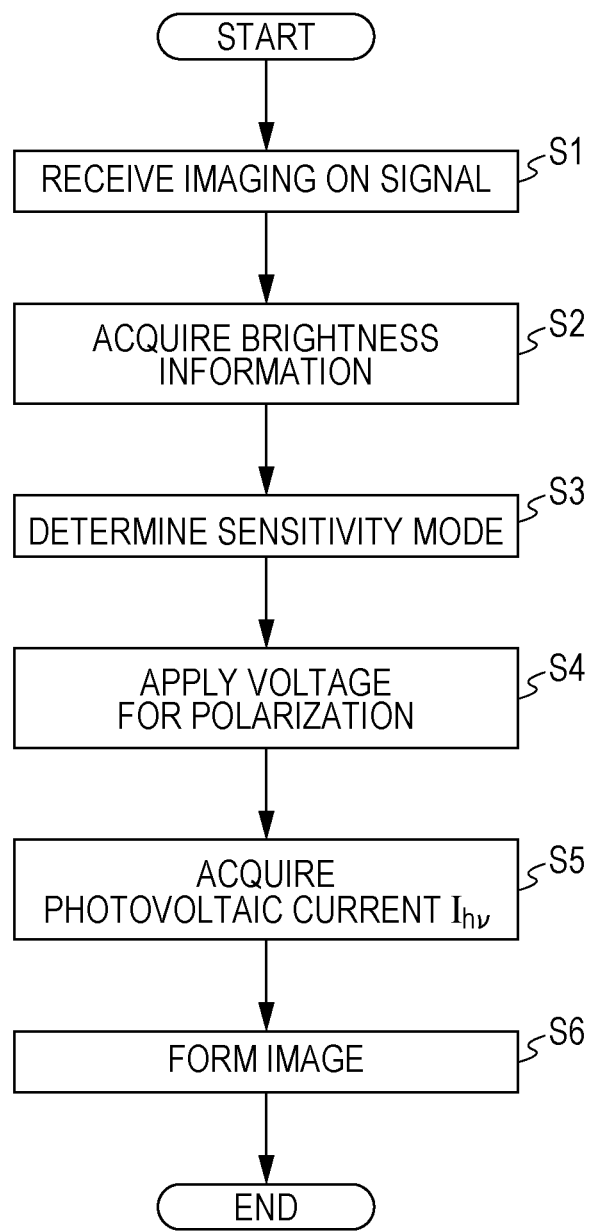

SOLID STATE IMAGING DEVICE AND IMAGE ACQUISITION METHOD USING SOLID STATE IMAGING ELEMENTS HAVING A PN JUNCTION

BACKGROUND

1. Technical Field

The present invention relates to a solid state imaging device and an image acquisition method.

2. Related Art

In the related art, it has been known that, when light is applied to a semiconductor layer in which semiconductors having different types of carriers are connected, photovoltaic currents can be acquired due to the excitation of photoelectrons (internal photoelectric effect). A solid state imaging element, which is a semiconductor image sensor, is provided as an element which uses the effect.

Although the solid state imaging element is widely used for a digital image input device which is represented by a digital scanner, a digital camera, or the like, it has been known that an area (dynamic range) in which incident light can be detected is narrow and a range in which an excellent image can be acquired for a certain quantity of light, that is, an exposure time is narrow, compared to a silver salt film which is used for analog photography or the like. Here, there is a method of acquiring a plurality of pieces of image information for respective different exposure times. According to the method, an image is formed by merging the plurality of pieces of image information.

In addition, a method of setting two types of pixels which have different sensitivities to a group and separately reading the electric charge signals of the pixels in each group (for example, refer to JP-A-04-298175) is proposed as a method capable of forming an image without merging the plurality of pieces of image information. A solid state imaging device in which the center of the geometric shape of a light receiving element is shifted in a row direction and a column direction by half of pitch, a so-called a honeycomb arrangement, has been proposed (for example, refer to JP-A-2000-125209).

However, in the method of acquiring the plurality of pieces of image information for the respective different exposure times, the pieces of image information at different imaging timings are merged, and thus there is a possibility that positional displacement may occur in the formed image.

In addition, in the method disclosed in JP-A-04-298175, two types of pixels having different light sensitivities are mixed, with the result that only the pixels corresponding to half of the number of total pixels can be arranged, and thus there are problems in that it is difficult to secure a sufficient quantity of light and it is difficult to perform imaging with high sensitivity.

Further, in the apparatus disclosed in JP-A-2000-125209, an effective pixel area is reduced due to a wall member or the like which realizes a honeycomb arrangement, and thus it is difficult to secure a sufficient quantity of light and it is difficult to perform imaging with high sensitivity.

Such problems similarly exist in a solid state imaging device which includes the solid state imaging element using the internal photoelectric effect and an image acquisition method which uses the solid state imaging device in addition to the method disclosed in JP-A-04-298175 or the apparatus disclosed in JP-A-2000-125209.

SUMMARY

An advantage of some aspects of the invention is to provide a solid state imaging device and an image acquisition method capable of preventing the positional displacement of an image from occurring and it is possible to acquire an image with high sensitivity.

According to an aspect of the invention, there is provided a solid state imaging device including a plurality of solid state imaging elements in each of which a first electrode, a ferroelectric layer, and a second electrode which is a transparent electrode are laminated, and a PN junction is formed between the ferroelectric layer and the first electrode or the second electrode; a control section that acquires brightness information of an imaging target, and determines whether each of solid state imaging elements is set to operate in a high sensitivity mode or a low sensitivity mode based on the acquired brightness information; and a circuit that applies a voltage to the solid state imaging element based on the determination, and sets the solid state imaging element to operate in the low sensitivity mode or the high sensitivity mode, in which a photovoltaic current from the solid state imaging element which is set to operate in the high sensitivity mode or the low sensitivity mode is detected based on each mode, and an image is acquired based on the detection result.

According to the aspect, the solid state imaging element is compatible with a ferroelectric property and a PN junction diode property, and thus it is possible to change the PN junction diode property by changing the polarization direction of the induced dipole of the ferroelectric layer. Therefore, the polarization direction of the ferroelectric layer is changed based on the brightness information of the imaging target, with the result that sensitivity is changed, and thus a dynamic range is enlarged. Accordingly, since it is possible to form an image with one exposure, it is possible to prevent the positional displacement of the image by merging a plurality of pieces of image information and it is possible to acquire the image with high sensitivity.

Here, it is preferable that the control section compare the brightness information with a predetermined threshold, determine a polarization direction or a voltage value, which is in low sensitivity mode, with regard to the solid state imaging element in an area in which the brightness information is greater than the threshold, determine a polarization direction or a voltage value, which is in a second mode having higher sensitivity than in the high sensitivity mode, with regard to the solid state imaging element in an area in which the brightness information is equal to or less than the threshold, and control each of the solid state imaging elements to operate in the high sensitivity mode or the low sensitivity mode based on the determination. Accordingly, it is possible to secure the quantity of light in the high sensitivity mode, and it is possible to prevent the excessive quantity of light from being incorporated in the low sensitivity mode.

In addition, it is preferable that the polarization direction of the solid state imaging element be controlled such that a depletion layer according to the PN junction is enlarged in the high sensitivity mode, and the depletion layer according to the PN junction is reduced in the low sensitivity mode. Accordingly, it is possible to select the high sensitivity mode and the low sensitivity mode according to the brightness information.

In addition, it is preferable that the polarization direction of the plurality of solid state imaging elements be reset in advance such that all of the plurality of the solid state imaging elements are in the high sensitivity mode or the low sensitivity mode before setting the solid state imaging element to operate in the high sensitivity mode or the low sensitivity mode. Accordingly, it is sufficient to determine the polarization direction of only one of the high sensitivity mode and the low sensitivity mode.

In addition, it is preferable that the ferroelectric layer be a p-type semiconductor. Accordingly, it is possible to easily provide the solid state imaging device using a transparent electrode (ITO) composed mainly of, for example, Indium oxide tin which is an n-type semiconductor as the second electrode.

In addition, it is preferable that the ferroelectric layer include bismuth (Bi) and iron (Fe). Accordingly, it is possible to form the ferroelectric layer as, for example, a complex oxide having a perovskite structure which contains bismuth (Bi) and iron (Fe). Accordingly, it is possible to provide the solid state imaging device capable of reducing environmental load using a non-lead material which does not include lead.

In addition, it is preferable that the ferroelectric layer include at least one type which is selected from a group including lanthanum (La), manganese (Mn), and titanium (Ti). Accordingly, it is possible to reduce leakage currents, thereby further improving the sensitivity of the solid state imaging device.

According to another aspect of the invention, there is provided an image acquisition method using a solid state imaging device which includes a plurality of solid state imaging elements in each of which a first electrode, a ferroelectric layer, and a second electrode which is a transparent electrode are laminated; and a PN junction is formed between the ferroelectric layer and the first electrode or the second electrode, the image acquisition method including: acquiring brightness information of an imaging target; determining whether each of solid state imaging elements is set to operate in a high sensitivity mode or a low sensitivity mode based on the brightness information; setting the solid state imaging element to operate in the low sensitivity mode or the high sensitivity mode based on the determination; detecting a photovoltaic current from the solid state imaging element which is set to operate in the high sensitivity mode or the low sensitivity mode based on each mode; and acquiring an image based on the detection result.

According to the aspect, the solid state imaging element is compatible with a ferroelectric property and a PN junction diode property, and thus it is possible to change the PN junction diode property by changing the polarization direction of the induced dipole of the ferroelectric layer. Therefore, the polarization direction of the ferroelectric layer is changed based on the brightness information of the imaging target, with the result that sensitivity is changed, and thus a dynamic range is enlarged. Accordingly, since it is possible to form an image with one exposure, it is possible to prevent the positional displacement of the image by merging a plurality of pieces of image information and it is possible to acquire the image with high sensitivity.

BRIEF DESCRIPTION OF THE DRAWINGS

FIG. 6 is a block diagram of the solid state imaging device according to the embodiment.

FIGS. 7(a) and 7(b) are conceptual diagrams illustrating an image acquisition process by the solid state imaging device according to the embodiment.

FIG. 8 is a flowchart illustrating the image acquisition method by the solid state imaging device according to the embodiment.

DESCRIPTION OF EMBODIMENTS

Embodiment

Figure 1:
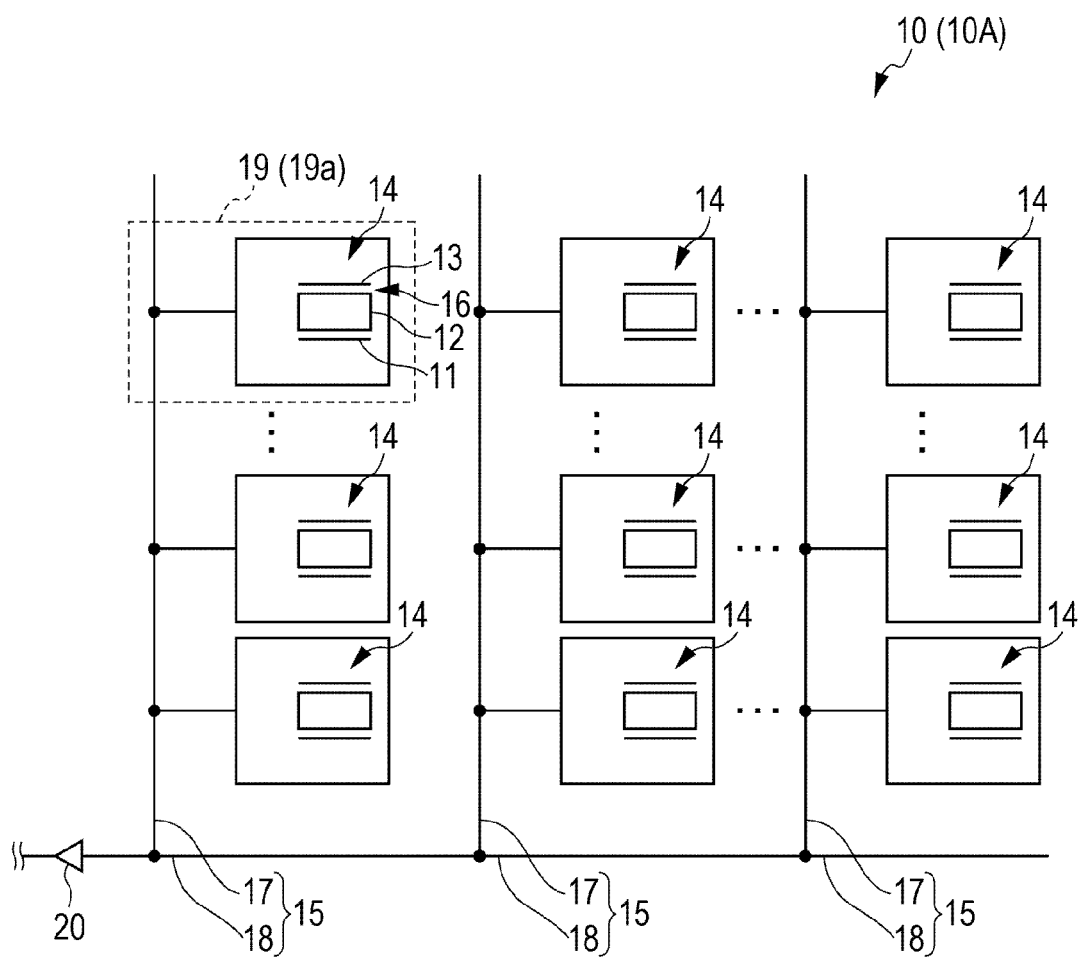
FIG. 1 is a diagram illustrating the schematic configuration of a solid state imaging device according to an embodiment.
Figure 2:
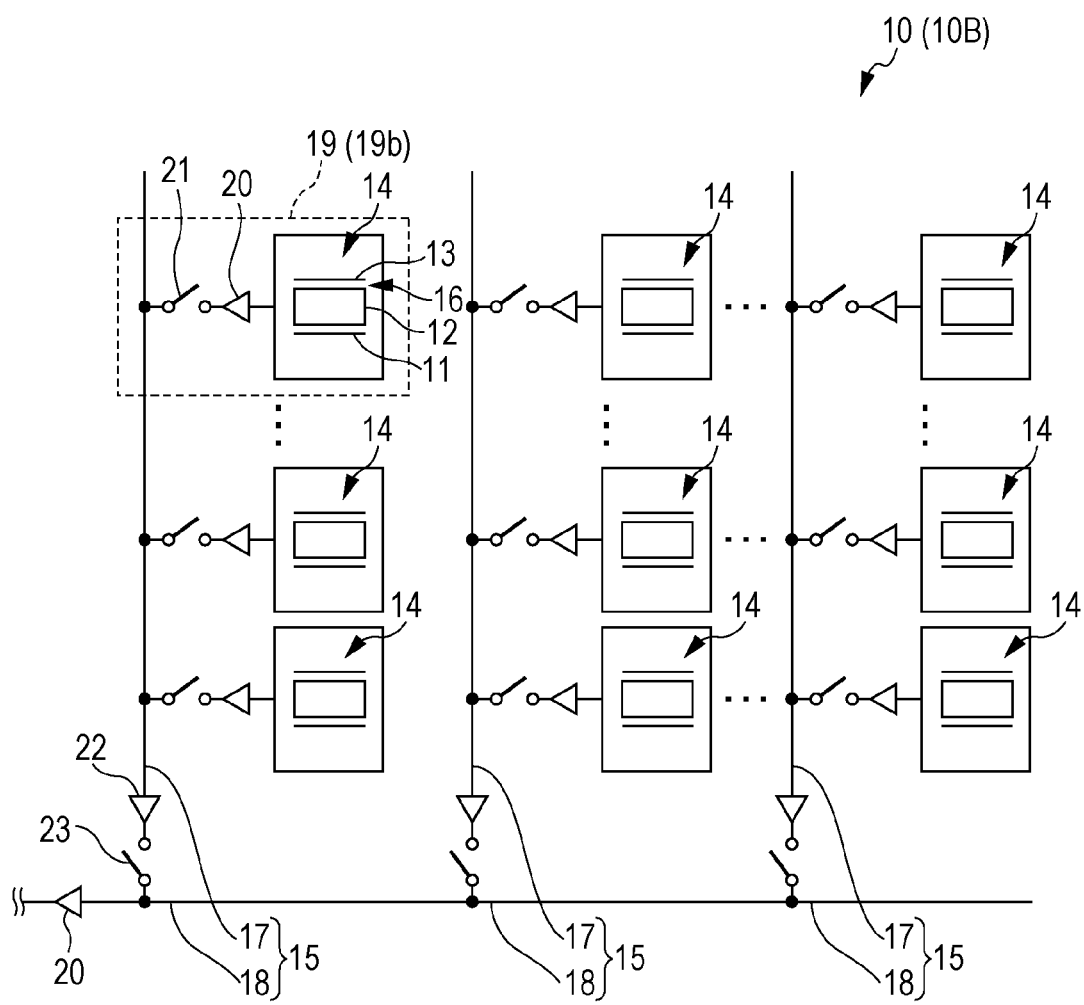
FIG. 2 is a diagram illustrating the schematic configuration of the solid state imaging device according to the embodiment.

FIGS. 1 and 2 are diagrams illustrating examples of the configuration of a solid state imaging device according to an embodiment of the invention.

As shown in the drawings, a solid state imaging device 10 according to the embodiment includes a plurality of solid state imaging elements 14 each of which a first electrode 11, a ferroelectric layer 12, and a second electrode 13 are laminated, and a transfer circuit 15 that transfers an electric charge signal from each of the solid state imaging elements 14.

In the solid state imaging element 14, the second electrode 13 is a transparent electrode and a PN junction 16 is formed between the ferroelectric layer 12 and the second electrode 13. Accordingly, the solid state imaging element 14 is compatible with a ferroelectric property and a PN junction diode property, and thus it is possible to change the PN junction diode property by changing the direction of polarization of the induced dipole of the ferroelectric layer 12 (there is a case being simply abbreviated as "polarization of a ferroelectric layer").

The transfer circuit 15 includes a vertical transfer circuit 17 which is connected to each of the solid state imaging elements 14 and a horizontal transfer circuit 18 which has a transfer end portion connected to the vertical transfer circuit 17. The horizontal transfer circuit 18 is connected to a control section (reference numeral 33 shown in FIG. 6), and can transfer an electric charge signal from the solid state imaging element 14.

Pixels 19 are formed by including the solid state imaging element 14 and the vertical transfer circuit 17. Although the pixels 19 are arranged two-dimensionally along each of the plurality of respective vertical transfer circuits 17 in the embodiment, the pixels 19 may be arranged one dimensionally.

In the embodiment, for example, a CCD type configuration shown in FIG. 1 may be used. Accordingly, it is possible to prevent the positional displacement of an image by merging a plurality of pieces of image information and it is possible to acquire an image with high sensitivity, and thus it is possible to provide a solid state imaging device 10A in which it is easy to avoid the enlargement of pixels 19a.

In such a configuration, it is possible to arrange a well-known amplifier 20, which amplifies an electric charge signal from the solid state imaging device 10, in the horizontal transfer circuit 18 if necessary. Another configuration may be added or omitted without departing from the gist of the invention.

In such a solid state imaging device 10A, light is converted into an electric charge signal and the electric charge signal is accumulated in each of the solid state imaging elements 14 within each of the pixels 19a. The electric charge signals which are accumulated in the entire solid state imaging elements 14 are simultaneously transferred to the vertical transfer circuit 17, and transferred to the horizontal transfer circuit 18 through the vertical transfer circuit 17. Thereafter, the electric charge signals are amplified by the amplifier 20, which is arranged if necessary, and are transmitted to the control section.

In addition, in the embodiment, for example, a CMOS-type configuration shown in FIG. 2 may be used. Accordingly, it is possible to prevent the positional displacement by merging the plurality of pieces of image information and it is possible to acquire an image with high sensitivity, and thus it is possible to provide a solid state imaging device 10B in which low power consumption is necessary and a speed is easily increased.

In such a configuration, it is possible to arrange the amplifier 20 and a pixel selection switching element 21 between the solid state imaging element 14 and the vertical transfer circuit 17 if necessary. In addition, it is possible to arrange a predetermined column circuit 22 and a column selection switching element 23 between the vertical transfer circuit 17 and the horizontal transfer circuit 18 if necessary. Another configuration may be added or omitted without departing from the gist of the invention.

In the solid state imaging device 10B, light is converted into an electric charge signal and the electric charge signal is accumulated in each of the solid state imaging elements 14 within each of the pixels 19b. The accumulated electric charge signal is amplified by the amplifier 20 which is arranged within the pixel 19b, and is transferred to the vertical transfer circuit 17 for each line (for each row) by turning on the pixel selection switching element 21. Further, noise is removed by a column circuit 22, which is arranged for each vertical transfer circuit 17, and the electric charge signal is temporally preserved. Thereafter, the preserved electric charge signal is transferred to the horizontal transfer circuit 18 by turning on the column selection switching element 23, and is transferred to the control section (reference numeral 33 shown in FIG. 6).

As above, the embodiment can be applied to any form which forms the pixel 19a, which includes the solid state imaging element 14 and the vertical transfer circuit 17, and the pixel 19b, which includes the amplifier 20 and the pixel selection switching element 21 in addition to the pixel 19a, and it is possible to implement various configurations according to a purpose and a usage form. Therefore, the degree of freedom of the configuration is high, and thus it is easy to realize a simple configuration.

Figure 3:
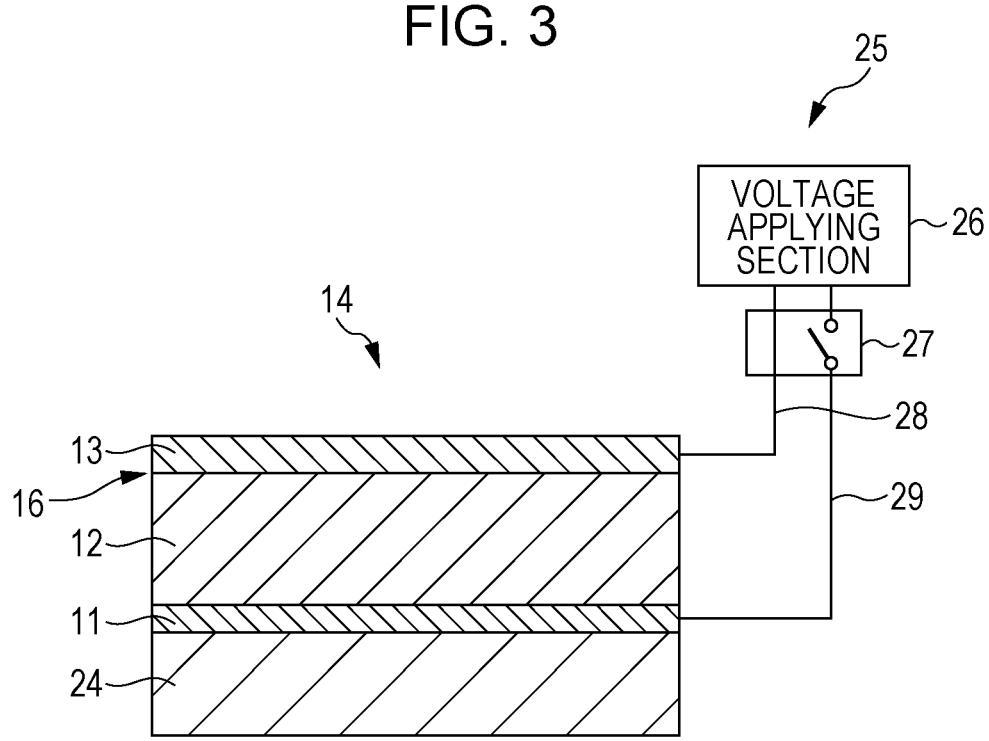
FIG. 3 is a diagram illustrating the schematic configuration of a solid state imaging element.

Subsequently, an example of the configuration of the solid state imaging element 14 which is mounted on the solid state imaging device 10 according to the embodiment will be described with reference to FIG. 3. As shown in the drawing, the solid state imaging element 14 of the embodiment is configured in such a way that the first electrode 11, the ferroelectric layer 12, and the second electrode 13 are laminated on a substrate 24 in order. It is possible to use, for example, a silicon (Si) substrate or a glass substrate as the substrate 24. However, the substrate is not limited to the example. Although not shown in the drawing, an insulation layer or an adhesion layer may be provided between the substrate 24 and the first electrode 11. When the first electrode 11, the ferroelectric layer 12, the second electrode 13, and the like are configured to combine with the substrate 24, the substrate 24 may be omitted.

The first electrode 11 may be formed of a material which has conductivity, and the first electrode 11 can be formed of a metal material or a conductive polymer, such as platinum (Pt), iridium (Ir), gold (Au), aluminum (Al), copper (Cu), titanium (Ti), or stainless steel. The first electrode 11 may be formed by laminating a plurality of metal layers and metallic oxide layers.

The second electrode 13 is formed as a transparent electrode and incident light can pass therethrough. Although being changed according to the material or the like of the ferroelectric layer 12, it is possible to form the second electrode 13 using, for example, transparent electrode (ITO) composed mainly of Indium oxide ($In_2O_3$) to which tin is added by approximately several %. It has been known that the transparent electrode (ITO) functions as an n-type semiconductor.

It is not necessary that the second electrode 13 is optically transparent completely and the second electrode 13 may be substantially transparent. For example, the second electrode 13 may have transmittance to the extent that incident light passes through the second electrode 13 and reaches the PN junction 16. When the film thickness of the second electrode 13 is large, carrier concentration rises, and thus conductivity is improved. In contrast, since a light transmission distance reaching the PN junction 16 is long, transmittance is easily deteriorated. Therefore, it is preferable that the film thickness of the second electrode 13 is appropriately selected by taking conductivity, transmittance, and the like into consideration based on a purpose and strength.

The ferroelectric layer 12 includes a ferroelectric property in which induced dipoles are voluntarily polarized by applying a voltage (polarization voltage). Here, a polarization voltage indicates a voltage to the extent that it is possible to polarize the induced dipoles in the predetermined direction based on the ferroelectricity of the ferroelectric layer 12.

It is possible to form the ferroelectric layer 12 as, for example, a p-type semiconductor. Accordingly, it is possible to form the PN junction 16 between the ferroelectric layer 12 and the second electrode 13 which is formed by the transparent electrode (ITO) functioning as the n-type semiconductor. Since the transparent electrode (ITO) is advantageous to treatment and economy, the transparent electrode is one of preferable forms because the easiness of the manufacture of the solid state imaging device 10 is improved. In this case, it is possible to polarize the ferroelectric layer 12 in a direction, in which + (plus) charges are induced to the side of the second electrode 13, from a point of view of effective photoelectric conversion.

Also, it is possible to form the ferroelectric layer 12 as the n-type semiconductor. In this case, the second electrode 13 is formed as the p-type semiconductor. At this time, it is possible to polarize the ferroelectric layer 12 in a direction, in which − (minus) charges are induced to the side of the second electrode 13, from the point of view of the effective photoelectric conversion.

In addition, it is possible to form the ferroelectric layer 12 such that the ferroelectric layer 12 contains bismuth (Bi) and iron (Fe). Accordingly, it is possible to form the ferroelectric layer 12 as a complex oxide of a perovskite structure which contains Bi and Fe. That is, it is possible to representatively form the ferroelectric layer 12 as the complex oxide of the perovskite structure of a Bismuth system ferrate. Since the complex oxide does not include lead which is an issue of environmental load, it is possible to realize the solid state imaging device 10 capable of reducing the environmental load using a non-lead material.

The complex oxide of the perovskite structure forms an octahedron in such a way that oxygen at an A site is in 12-coordination and oxygen at a B site is in 6-coordination. A part of Bi at the A site and Fe at the B site may be replaced by various elements.

For example, it is preferable that the ferroelectric layer 12 include at least one type which is selected from a group including lanthanum (La), manganese (Mn), and titanium (Ti). Accordingly, for example, it is possible to reduce leakage currents in a situation in which the non-lead material is used, and thus it is possible to improve the reliability of the solid state imaging device 10. In addition, it is possible to increase the degree of freedom of the material which forms the ferroelectric layer 12.

More specifically, La may be used as an element which replaces Bi at the A site and Mn may be used as an element which replaces Fe at the B site. The complex oxide is called a Bismuth Lanthanum Ferrate Manganate (BLFM) and is expressed using the following composition formula (1).

Formula 1

$(Bi_{1-x}La_x)(Fe_{1-y}Mn_y)O_3$ (1)

(In the formula, both x and y are values which are greater than 0 and less than 1)

In addition, Fe at the B site of the ferroelectric layer 12 of the BLFM may be replaced by Ti. The complex oxide is expressed in the following composition formula (2).

Formula 2

$(Bi_{1-x}La_x)(Fe_{1-y-z}Mn_yTi_z)O_3$ (2)

(In the formula, all of x, y and z are values which are greater than 0 and less than 1)

However, the composition of the ferroelectric layer 12 is not limited to the example, and includes a composition, which is deviated from the composition of stoichiometry due to loss or excessiveness, and a composition in which a part of an element is replaced by another element.

Bi at the A site of the ferroelectric layer 12 may be replaced by samarium (Sm), cerium (Ce), or the like, and Fe at the B site may be replaced by aluminum (Al), cobalt (Co), or the like. Even in a case of the complex oxide which includes other elements, it is preferable that complex oxide is configured to have the perovskite structure.

That is, it is possible to use bismuth ferrate ($BiFeO_3$), bismuth ferrate aluminate ($Bi(Fe, Al)O_3$), bismuth ferrate manganate ($Bi(Fe, Mn)O_3$), Bismuth lanthanum ferrate manganate ($(Bi, La) (Fe, Mn)O_3$), bismuth ferrate cobaltate ($Bi(Fe, Co)O_3$), bismuth cerium ferrate ($(Bi, Ce)FeO_3$), bismuth cerium ferrate manganate ($(Bi, Ce) (Fe, Mn)O_3$), bismuth lanthanum cerium ferrate ($(Bi, La, Ce)FeO_3$), Bismuth lanthanum ferrate manganate cerium ($(Bi, La, Ce) (Fe, Mn)O_3$), bismuth samarium ferrate ($(Bi, Sm)FeO_3$), bismuth chromate ferrate ($Bi(Cr, Fe)O_3$), or the like as an example of the ferroelectric layer 12.

It is possible to apply polarization inversion currents (polarization process) to the solid state imaging element 14 by the circuit 25. The circuit 25 includes, for example, a voltage applying section 26, a switching element 27, such as a Field Effect Transistor (TFT), which is provided between the voltage applying section 26 and the solid state imaging element 14, and each of the sections is connected to the control section (reference numeral 33 shown in FIG. 6). The switching element 27 may be omitted.

The voltage applying section 26 is a part that generates the polarization voltage according to the control signal, and a well-known power device can be used. The voltage applying section 26 can be electrically connected to the first electrode 11 and the second electrode 13 through the switching element 27, and can be connected and fixed to the solid state imaging element 14 using, for example, wirings 28 and 29. Therefore, it is possible to improve structural stability.

In contrast, the voltage applying section 26 can be separated from the solid state imaging element 14 without departing from the gist of the invention, and may be in a state which is electrically connected to the solid state imaging element 14 at a predetermined time before exposure is performed. Accordingly, it is easy to carry out repair and maintenance work.

Figure 4:
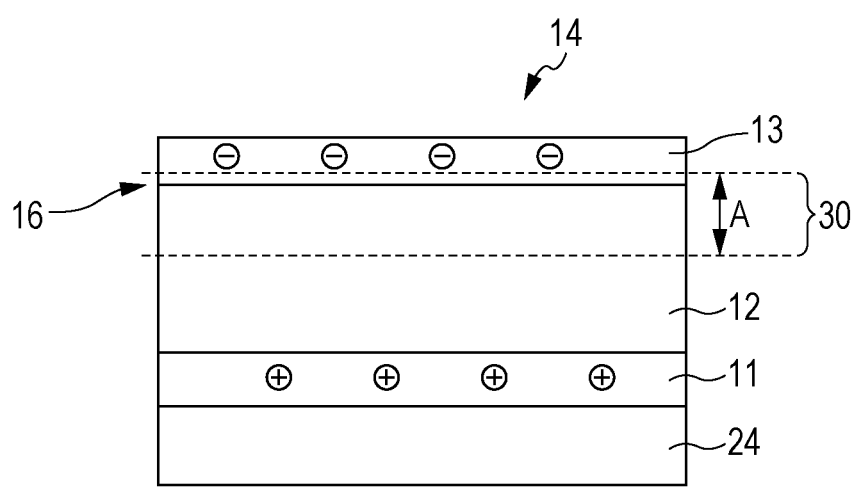
FIG. 4 is a diagram illustrating an operation performed by the solid state imaging element.

Subsequently, an operation which is related to the solid state imaging element 14 of the embodiment will be described with reference to FIGS. 4 and 5. FIGS. 4 and 5 are enlarged diagrams illustrating the vicinity of the PN junction 16 of the solid state imaging element 14.

As shown in FIG. 4, when the PN junction is formed by generally connecting the p-type semiconductor and the n-type semiconductor to each other, the holes of the p-type semiconductor move to the side of the n-type semiconductor and the electrons of the n-type semiconductor move to the side of the p-type semiconductor due to an internal electric field in which the p-type semiconductor is positive and the n-type semiconductor is negative. As a result, a depletion layer 30 having a predetermined width A, in which few carriers (holes and electrons) exist, is formed in the vicinity of the PN junction.

The depletion layer 30 is a part that affects the PN junction diode property of the solid state imaging element 14. When the depletion layer 30 is enlarged, an electrostatic capacity is lowered, and thus electrical output having high linearity may be acquired with regard to the illumination of light. That is, it is possible to cause the solid state imaging element 14 to have high sensitivity.

Figure 5A:
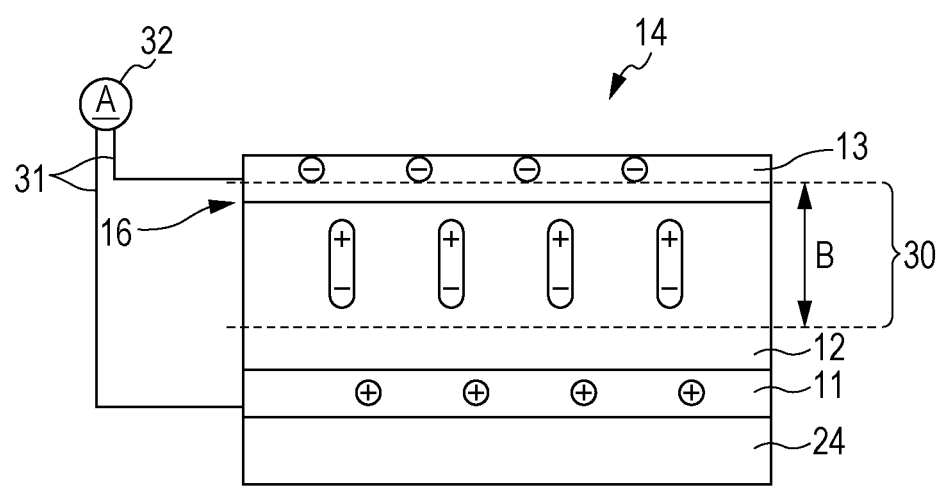
FIGS. 5(a) and 5(b) are diagrams illustrating the operation performed by the solid state imaging element.

Here, as shown in FIG. 5(a), it is possible to perform the polarization process on the ferroelectric layer 12 in a direction in which − (minus) charges are induced to the side of the ferroelectric layer 12 which is the p-type semiconductor and + (plus) charges are induced to the side of the second electrode 13 which is the n-type semiconductor. Accordingly, a state, in which a downward (direction from the side of the second electrode 13 to the side of the ferroelectric layer 12) electrical field is applied in the vicinity of the PN junction 16, is acquired, and thus the enlarged depletion layer 30 is acquired (width B shown in FIG. 5(a)>width A shown in FIG. 4). That is, a high sensitivity mode of the solid state imaging element 14 is acquired.

Figure 5B:
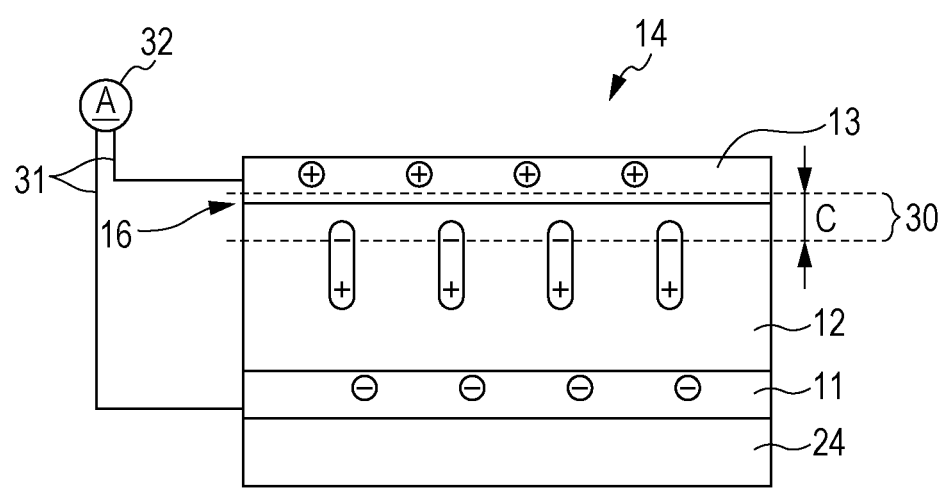

In contrast, as shown in FIG. 5(b), it is possible to perform the polarization process on the ferroelectric layer 12 in a direction in which + (plus) charges are induced to the side of the ferroelectric layer 12 which is the p-type semiconductor and − (minus) charges are induced to the side of the second electrode 13 which is the n-type semiconductor. Accordingly, a state, in which an upward (direction from the side of the ferroelectric layer 12 to the side of the second electrode 13) electrical field is applied in the vicinity of the PN junction 16, is acquired, and thus the reduced depletion layer 30 is acquired (width C shown in FIG. 5(b)<width A shown in FIG. 4). That is, the low sensitivity mode of the solid state imaging element 14 is acquired.

In the solid state imaging element 14, when light, which passes through the second electrode 13, which is the n-type semiconductor reaches the PN junction 16, the light is absorbed by the ferroelectric layer 12 or the second electrode 13, and thus the carriers are generated. With regard to the generated carriers, the electrons and holes move due to an internal electric field which is formed by the ferroelectric layer 12 or the second electrode 13, and thus the photovoltaic current $I_{hv}$ is generated.

When the photovoltaic current $I_{hv}$ is detected, a well-known current detection device 32, the first electrode 11, and the second electrode 13 may be connected by, for example, wirings 31. The current detection device 32 is connected to the control section (reference numeral 33 shown in FIG. 6), and the detected photovoltaic current $I_{hv}$ is used for an image processing.

In the high sensitivity mode and the low sensitivity mode of the solid state imaging element 14, a certain quantity of light, that is, the quantity of photovoltaic current $T_{hv}$, which is detected with regard to an exposure time, varies. That is, the photovoltaic current $I_{hv}$ is detected with high sensitivity due to the depletion layer 30, which has an enlarged width B, in the polarization direction of FIG. 5(a) and is detected with low sensitivity due to the depletion layer 30, which has a reduced width C, in the polarization direction of FIG. 5(b).

Accordingly, a larger quantity of light is incorporated using the high sensitivity mode for an area in which the brightness information is low by adjusting the polarization direction of the ferroelectric layer 12, and thus it is possible to acquire image information without omission (so-called black defects) of information. In addition, it is possible to suppress the excessive incorporation of the quantity of light (so-called a white kite) using the low sensitivity mode with regard to an area in which the brightness information is high. Accordingly, it is possible to enlarge a dynamic range. It is possible to perform the selection of the high sensitivity mode and the low sensitivity mode, that is, the determination of the polarization direction of the ferroelectric layer 12 in the control section 33 shown in FIG. 6.

FIG. 6 is a block diagram of the solid state imaging device 10 in the embodiment. FIG. 7(a) is a schematic diagram illustrating an image acquisition process by the solid state imaging device 10 according to the embodiment. FIG. 7(b) is a diagram illustrating a method of acquiring a plurality of pieces of image information for each different exposure time according to the related art. Also, an outdoor scene, which includes a stationary sun and mountains and a fast moving vehicle as imaging targets, will be described as an example.

As shown in FIG. 6, the solid state imaging device 10 includes the control section 33, the solid state imaging element 14, and the current detection device 32. In addition, the solid state imaging device 10 includes a shutter device 36 and the circuit 25. The control section 33 is formed with a well-known microcomputer as the center, and is connected to the circuit 25 and the current detection device 32.

The control section 33 acquires the brightness information and determines whether the solid state imaging element 14 is in the low sensitivity mode or the high sensitivity mode for each area. It is possible to acquire the brightness information through, for example, the well-known shutter device 36. The shutter device 36 operates so as to be closed in a predetermined time or be closed and opened, when receiving an imaging ON instruction by the imaging person (for example, a shutter button ON operation by the imaging person). When the shutter device 36 is opened, the brightness information of the imaging target (refer to (a2) in FIG. 7(a)) can be acquired by the control section 33 through the solid state imaging element 14 and the wirings 31.

An example of the acquired brightness information may be, for example, a brightness value. However, the brightness information is not limited to the example and may be a value which correlates with the brightness value. The acquired brightness information may be corrected using various detection values. If the threshold is set to a fixed value, it is possible to suppress workload. However, the threshold may be determined whenever an image is acquired using the various detection values so as to cope with the change of imaging environment.

It is possible to set a timing that the brightness information is acquired to, for example, a time point at which an imaging ON signal is received by an imaging person. It is possible to use, for example, a shutter button ON signal by the imaging person as the imaging ON signal. Since it is common that a period, which is required for polarization inversion performed by applying the polarization voltage after the shutter button is pressed, is sufficiently shorter than a process period from when the shutter button is pressed to when an image is acquired by the solid state imaging device 10, it is possible to use the shutter button ON signal as the imaging ON signal by the imaging person. In addition, when the solid state imaging device 10 has a live-view function, it is possible to treat the live-view function that is displayed as the imaging ON signal.

The control section 33 compares the brightness information which is obtained by such a manner with a predetermined threshold, and determines whether the solid state imaging element 14 is in the high sensitivity mode or the low sensitivity mode for each area (refer to (a3) in FIG. 7(a)). It is determined that the solid state imaging device disposed in the former area is set to a polarization direction of the low sensitivity mode, and the solid state imaging element 14 disposed in the latter area is set to a polarization direction of the high sensitivity mode. Furthermore, the instruction signal is output by the control section 33 to the circuit 25 based on the above-described determination. A required voltage (hereinafter, referred to as a polarization voltage) is applied to the solid state imaging element 14 by the circuit 25 based on the instruction signal. Accordingly, the solid state imaging element 14 disposed in an area in which the brightness information is greater than the threshold can be set to operate in the low sensitivity mode, and the solid state imaging element 14 disposed in an area in which the brightness information is equal to or less than the threshold can be set to operate in the high sensitivity mode.

When the polarization voltage is applied, the polarization voltage may be given in the high sensitivity mode or the low sensitivity mode with respect to all of the solid state imaging elements 14. However, for example, when the solid state imaging element 14 is in any one state of the high sensitivity mode or the low sensitivity mode in advance, as a state of after resetting to be described below, it is sufficient to apply the polarization inversion voltage to only the solid state imaging element 14 which is changed from the high sensitivity mode to the low sensitivity mode or from the low sensitivity mode to the high sensitivity mode. A case where the polarization inversion voltage is applied to only the desired solid state imaging element 14 is also regarded as a case of applying the polarization voltage.

Since the solid state imaging element 14 which is disposed in the area in which the brightness information of the imaging target is equal to or less than the threshold secures a larger quantity of light, the solid state imaging element 14 is controlled to operate in the high sensitivity mode. That is, it is controlled to be the enlarged depletion layer 30 such as the width B shown in FIG. 5(*a*). Since such a control is carried out, the instruction signal is output to the circuit 25 by the control section 33 such that the polarization direction of the ferroelectric layer 12 is a direction (direction shown in FIG. 5(*a*)) in which the − (minus) charges are induced to the side of the ferroelectric layer 12 which is the p-type semiconductor.

In contrast, since the solid state imaging element 14 which is disposed in the area in which the brightness information of the imaging target is greater than the threshold prevents the excessive quantity of light from being incorporated therein, the solid state imaging element 14 is controlled to operate in the low sensitivity mode. That is, it is controlled to be the reduced depletion layer 30 such as the width C shown in FIG. 5(*b*). Since such a control is carried out, the instruction signal is output to the circuit 25 by the control section 33 such that the polarization direction of the ferroelectric layer 12 is a direction (direction shown in FIG. 5(*b*)) in which the + (plus) charges are induced to the side of the ferroelectric layer 12 which is the p-type semiconductor.

The instruction signal is output to the circuit 25 by the control section 33 based on the determination result, and the polarization voltage is applied to the solid state imaging element 14 by the circuit 25. As a result, in the solid state imaging device 14 disposed in an area which is received the instruction of the high sensitivity mode, the depletion layer 30 is enlarged due to the PN junction 16. In the solid state imaging device 14 disposed in an area which is received the instruction of the low sensitivity mode, the depletion layer 30 is reduced due to the PN junction 16. Hereinafter, a series of controls from acquiring the brightness information by the control section 33 to setting the solid state imaging device 14 to operate in the high sensitivity mode or the low sensitivity mode for each area, is referred to as a "mode control of a polarization direction".

The description described above is an example acquired when the second electrode 13 is formed as the n-type semiconductor. When the second electrode 13 is formed as the p-type semiconductor, an instruction signal which is an inverse of the instruction is output. That is, when the second electrode 13 is formed as the p-type semiconductor, in the area in which the brightness information is greater than the threshold, the control section 33 determines that the low sensitivity mode is preferable, and thus the instruction signal is output such that the polarization direction is the direction shown in FIG. 5(*b*). In contrast, in the area in which the brightness information is equal to or less than the threshold, it is determined that the high sensitivity mode is preferable, and thus the instruction signal is output such that the polarization direction is the direction shown in FIG. 5(*a*).

It is possible to determine a preferable situation in advance through an examination or the like with regard to a treatment performed when the brightness information is equal to the threshold. The situation may be a situation included in a case in which the threshold is greater than the brightness information or a case in which the threshold is smaller than the brightness information. In the description described above, a case where the brightness information is equal to the threshold is regarded as a case where the threshold is small.

Here, it is preferable that the polarization process is performed on all of the solid state imaging elements 14 in advance such that at least one direction of the polarization directions is set to operate in the high sensitivity mode or the low sensitivity mode, before the mode control of the polarization direction is carried out (hereinafter, such a process is referred to as a "resetting"). Accordingly, according to the solid state imaging element 14 in which, in the mode control of the polarization direction, the determination result by the control section 33 coincides with the polarization direction in the high sensitivity mode or the low sensitivity mode, which is maintained in advance, it is unnecessary to change the polarization direction, and it is sufficient to change the polarization direction for only the solid state imaging element 14 in which the determination result is different from the polarization direction which is maintained in advance.

That is, when the resetting is performed such that the all of the solid state imaging elements 14 are in the high sensitivity mode, the polarization voltage may be applied to only the solid state imaging element 14 disposed in the area in the low sensitivity mode according to the brightness information.

In contrast, when the resetting is performed such that all of the solid state imaging elements 14 are in the low sensitivity mode, the polarization voltage may be applied to only the solid state imaging element 14 disposed in the area in the high sensitivity mode according to the brightness.

For example, the reset signal is output from the control section 33, and the polarization direction of the solid state imaging element 14 is in any one of the high sensitivity mode or the low sensitivity mode through the circuit 25, and thus, the resetting can be performed. In addition, when before performing the mode control of the polarization direction, the resetting may be performed in any timing. For example, the resetting can be performed when a power supply switch of the solid state imaging device 10 is turned on by the imaging person. In addition, the mode controls of the resetting and the polarization direction may be performed continuously in this order, at a timing to perform the mode control of the polarization direction.

In the above-described example, the control section 33 determines to select the polarization direction of the solid state imaging element 14. However, the control section 33 may determine the voltage values which are given to each solid state imaging element 14 instead of the polarization direction.

In this case, it is possible to form the control section 33 such that the control section 33 compares the brightness information with the predetermined threshold and determines a voltage value in the low sensitivity mode with regard to the solid state imaging element 14 in an area in which the brightness information is greater than the threshold. In addition, it is possible to determine the voltage value in the second mode (high sensitivity mode) with regard to the solid state imaging element 14 in the area in which the brightness information is equal to or less than the threshold. Accordingly, the polarization voltage is applied to the solid state imaging element 14 by the circuit 25 based on the determined voltage value. There is a different point between the examples, in the above-described example, the determination result of the control section 33 is the polarization direction, and in the example described here, the determination result is the voltage value. However, a point that the control section 33 determines that the solid state imaging element 14 is in the high sensitivity mode or the low sensitivity mode for each area based on the brightness information, and controls the polarization direction of the solid state imaging element 14 based on the determination result is same as the above-described example.

According to this, after performing the mode control of the polarization direction, the photovoltaic current $I_{hv}$ is generated from the solid state imaging element 14 based on each mode. The photovoltaic current $I_{hv}$ is detected by the current detection device 32. The detection values are acquired by the control section 33.

When the image processing function is given to the control section 33, an image (refer to (a4) in FIG. 7(*a*)) is acquired by processing the image using the control section 33 based on the detection values of the photovoltaic current $I_{hv}$ which varies according to the polarization direction according to the bright information. When the image processing function is not given to the control section 33, an image is acquired by transporting the detection values of the photovoltaic current $I_{hv}$ to an image process section (not shown) which is provided separately from the control section 33, and by processing the image using the image processing section.

In the method according to the related art shown in FIG. 7(*b*), the pieces of image information, in which exposure times, that is, imaging timings are different, are merged. Therefore, particularly with regard to the fast moving vehicle in the drawing, the deviation in the pieces of image information is large because the fast moving vehicle is imaged at different timings. Therefore, there is a possibility that positional displacement occurs in the formed image.

In contrast, in the process according to the embodiment shown in FIG. 7(*a*), brightness information is acquired for an actual outdoor scene, and, for example, it is determined that brightness information is higher than the threshold with regard to the top of the mountain, the sun, and the background and that brightness information is equal to or less than the threshold with regard to the base of the mountain, a vehicle body and wheels.

Further, since the excessive quantity of light is prevented from being incorporated in the area in which the brightness information is greater than the threshold, the reduced depletion layer 30 such as the width C, that is, the low sensitivity mode is preferable. Therefore, the ferroelectric layer 12 is adjusted in the polarization direction shown in FIG. 5(*b*).

In addition, since a larger quantity of light is secured in the area in which the brightness information is equal to or less than the threshold, the enlarged depletion layer 30 such as the width B is preferable, that is, the high sensitivity mode is preferable. Therefore, the ferroelectric layer 12 is adjusted in the polarization direction shown in FIG. 5(*a*).

As above, it is possible to suppress a larger quantity of light from being incorporated in an area in which brightness is low using the high sensitivity mode and it is possible to suppress the excessive quantity of light from being incorporated in an area in which brightness is high using the low sensitivity mode, and thus it is possible to enlarge a dynamic range. The detection values of the photovoltaic current $I_{hv}$ which varies according to the polarization direction according to the brightness information is acquired, and thus it is possible to form an image based on the detection values of the photovoltaic current $I_{hv}$.

Accordingly, since it is possible to form an image with one-time exposure, it is possible to prevent the positional displacement of the image from occurring by merging the plurality of pieces of image information and it is possible to acquire an image with high sensitivity.

Next, the image acquisition method according to the solid state imaging device 10 of the embodiment will be described with reference to FIG. 8. FIG. 8 is a flowchart illustrating an example of the image acquisition method according to the embodiment.

For example, the imaging ON signal is received by the imaging person using the control section 33 in step S1. For example, the brightness information of the imaging target is acquired through the solid state imaging element 14 and wirings 31 using the control section 33 in step S2. The brightness information acquired in step S2 is compared with the threshold, and it is determined whether each of the solid state imaging elements is in the high sensitivity mode or the low sensitivity mode in step S3. In step S3, processes may be executed by an external processor instead of the control section 33. When using the external processor, the brightness information is transmitted to the external processor, and the determined result obtained by the processor may be input to the control section 33. Processes to acquire the brightness information and to determine the mode of the ferroelectric layer 12 based on the brightness information are realized in steps S2 and S3.

Thereafter, the instruction signal is output to the circuit 25 by the control section 33 based on the determination acquired in step S3, and the polarization voltage is applied to the solid state imaging element 14 by the circuit 25 based on the instruction signal in step S4. A process to apply the polarization voltage to the ferroelectric layer 12 is realized based on the determination by performing a process in step S4.

The detection values of the photovoltaic current $I_{hv}$ are acquired from the solid state imaging element 14 in a state where the mode control of the polarization direction is performed through the current detection device 32 using the control section 33, in step S5. An image is formed by the control section 33 or the image processing section (not shown) which is provided separately from the control section 33, based on the photovoltaic current $I_{hv}$, acquired in step S5, in step S6.

In step S1, when the live-view function that is displayed is treated as the imaging ON signal, the solid state imaging device 10 executes processes from steps S2 to S4 during live-viewing. When the shutter button is pressed by the imaging person, a signal different from the imaging ON signal (for example, the imaging ON signal) is received, the processes in steps S5 and S6 are executed.

When providing the process to reset the solid state imaging element 14, for example, a process to reset the solid state imaging element 14 from the control section 33 through the circuit 25 is added immediately after receiving the image ON signal by the imaging person in step S1, and thereafter, the processes in steps S2 to S4 may be executed. Otherwise, before performing the processes in steps S1 to S6, the process to reset the solid state imaging element 14 may be executed in advance by detecting a state where the power supply switch of the solid state imaging device 10 is turned on by the imaging person.

According to the image acquisition method according to the embodiment, the solid state imaging device 10 which includes the solid state imaging element 14 is used. Therefore, the polarization direction of the ferroelectric layer is caused to vary based on the brightness information of the imaging target, and thus it is possible to enlarge the dynamic range by varying the sensitivity.

Subsequently, an example of a method of manufacturing the solid state imaging device 10 according to the embodiment will be described with reference to FIGS. 9(*a*) to 9(*d*). In particular, FIGS. 9(*a*) to 9(*d*) are cross-sectional views illustrating an example of manufacturing the solid state imaging element 14 which is mounted on the solid state imaging device 10.

As shown in FIG. 9(*a*), a silicon dioxide (SiO2) film, which functions as an insulation layer 34, is formed on the surface of the silicon (Si) substrate 24 using thermal oxidation or the like, and an adhesion layer 35, which is formed of titanium oxide or the like, is formed on a silicon dioxide film using a sputtering method, thermal oxidation, or the like. Further, the first electrode 11, which is formed of platinum, iridium, iridium oxide, or a laminated structure thereof, is formed on the entire surface of the adhesion layer 35, using the sputtering method, an evaporation method, or the like. Also, the insulation layer 34 and the adhesion layer 35 may be omitted.

Figure 9A:
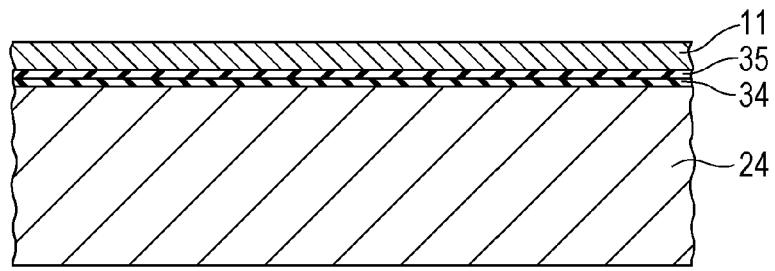
FIGS. 9(a)-9(d) are diagrams illustrating an example of a method of manufacturing the solid state imaging element according to the embodiment.
Figure 9B:
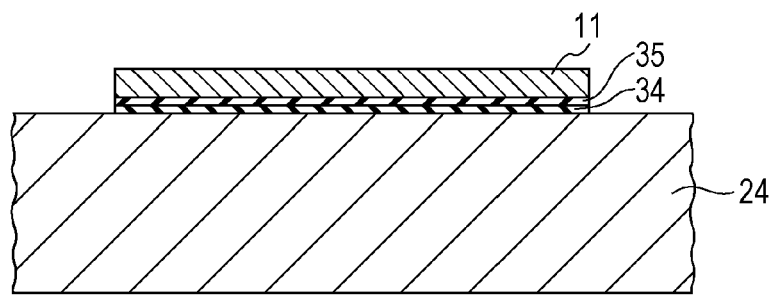

Subsequently, as shown in FIG. 9(b), the insulation layer 34, the adhesion layer 35, and the first electrode 11 are simultaneously patterned on the formed first electrode 11 while using a predetermined shaped resist (not shown in the drawing) as a mask.

Subsequently, the ferroelectric layer 12 is laminated on the first electrode 11. Although a method of manufacturing the ferroelectric layer 12 is not particularly limited, for example, it is possible to manufacture the ferroelectric layer 12 using a chemical solution method, such as a Metal-Organic Decomposition (MOD) method, a sol-gel method, or the like for acquiring the film of a ferroelectric substance, which is formed of metallic oxide, by coating and drying a solution, which includes a metal complex, and baking the solution at a high temperature. In addition, it is possible to manufacture the ferroelectric layer 12 using a liquid phase method or a solid phase method, such as a laser ablation method, the sputtering method, a pulse laser deposition method (PLD method), a CVD method, an aerosol deposition method, or the like.

More specifically, a precursor film is formed by coating a precursor solution for forming the ferroelectric layer 12 on the first electrode 11 using a spin coat method or the like (coating process), and the precursor film is heated at a predetermined temperature (for example, 150° C. to 200° C.) and is dried for a fixed time (drying process). Subsequently, the dried precursor film is heated at a predetermined temperature (for example, 350° C. to 450° C.) and is maintained for a fixed time, thereby being degreased (degreasing process). Thereafter, the precursor film is heated at a predetermined temperature (for example, 600° C. to 850° C.) and maintained for, for example, 1 minute to 10 minutes, thereby being crystallized (baking process). Therefore, the ferroelectric layer 12, which has the perovskite structure having, for example, Bi and Fe and which is formed of a complex oxide, is formed on the first electrode 11.

Figure 9C:
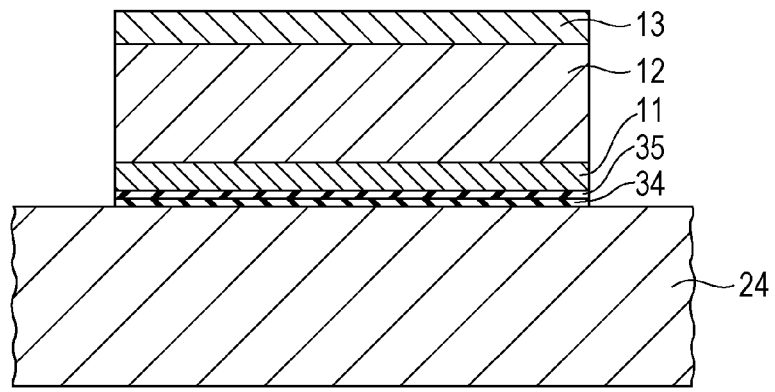
Figure 9D:
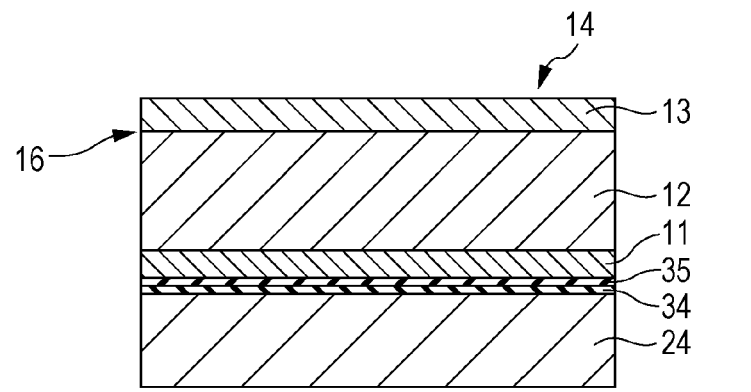

Subsequently, the second electrode 13, which functions as a transparent electrode (ITO) formed of Indium oxide tin or the like, is formed on the formed ferroelectric layer 12 using a sputtering method or the like, and the ferroelectric layer 12 and the second electrode 13 are simultaneously patterned if necessary as shown in FIG. 9(c). Further, the solid state imaging element 14, in which the first electrode 11, the ferroelectric layer 12, and the second electrode 13 are laminated, is formed as shown in FIG. 9(d) by reducing the thickness of the substrate 24 to a predetermined thickness or cutting unnecessary parts through dicing or the like. If necessary, it is possible to perform annealing at a predetermined temperature (for example, 600° C. to 850° C.) Therefore, it is possible to form excellent interfaces between the ferroelectric layer 12, the first electrode 11, and the second electrode 13, and it is possible to improve the crystallinity of the ferroelectric layer 12. Thereafter, when the manufactured solid state imaging element 14, the transfer circuit 15, and the like are combined and packaged, it is possible to manufacture the solid state imaging device 10 according to the embodiment.

Modification Example

Figure 10:
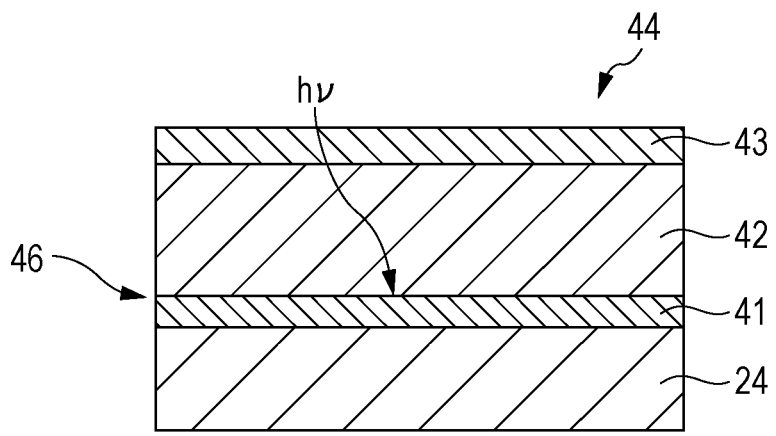
FIG. 10 is a diagram illustrating the schematic configuration of a solid state imaging element according to a modification example.

In the above-described solid state imaging element 14, the PN junction 16 is formed between the ferroelectric layer 12 and the second electrode 13, but instead of this, a solid state imaging element in which the PN junction is formed between the ferroelectric element and the first electrode may be adopted. FIG. 10 is a diagram illustrating the schematic configuration of such as a solid state imaging element 44.

As shown in FIG. 10, the solid state imaging element 44 according to the embodiment is formed in such a way that a first electrode 41, a ferroelectric layer 42, and a second electrode 43 are laminated, the second electrode 43 is a transparent electrode, and a PN junction 46 is formed between the ferroelectric layer 42 and the first electrode 41. The first electrode 41, the ferroelectric layer 42, and the second electrode 43 are laminated on a substrate 24 in order. The type of the substrate 24 is not limited and the substrate 24 can be omitted.

It is possible to form the first electrode 41 by adding, for example, a small amount of predetermined group 5 elements as donors so as to function as an n-type semiconductor. Accordingly, it is possible to form the ferroelectric layer 42 as a p-type semiconductor and to form the PN junction 46 between the first electrode 41 and the ferroelectric layer 42.

However, it is possible to form the first electrode 41 by adding, for example, a small amount of predetermined group 3 elements as acceptors so as to function as the p-type semiconductor. Accordingly, it is possible to form the ferroelectric layer 42 as the n-type semiconductor and to form the PN junction 46 between the first electrode 41 and the ferroelectric layer 42.

In addition, although it is possible to form the second electrode 43 according to the embodiment as a transparent electrode similarly to the second electrode 13 of the above-described solid state imaging element 14, it is not necessary to essentially include a function as the n-type semiconductor or the p-type semiconductor.

Here, the ferroelectric layer 42 is formed using a material which has a ferroelectric property and transparency (light permeability). Accordingly, light, which passes through the second electrode 43, further passes through the ferroelectric layer 42, and reaches the PN junction 46 which is formed between the ferroelectric layer 42 and the first electrode 41.

Here, the ferroelectric substance material which has the transparency (light permeability) may include, for example, lead titanate ($PbTiO_3$), lead zirconate titanate ($Pb(Zr,Ti)O_3$; PZT), potassium niobate ($KNbO_3$), sodium niobate ($NaNbO_3$), bismuth sodium titanate ($(Bi,Na)TiO_3$; BNT), and bismuth potassium titanate ($(Bi,K)TiO_3$; BKT).

When the ferroelectric layer 42 is formed as the p-type semiconductor, it is possible to perform the polarization process in a direction in which − (minus) charges are induced to the side of the first electrode 41 which is the n-type semiconductor and + (plus) charges are induced to the side of the ferroelectric layer 42 which is the p-type semiconductor when viewed from a point of view of effective photoelectric conversion. Therefore, the high sensitivity mode is realized.

Also, when the ferroelectric layer 42 is formed as the n-type semiconductor, it is possible to perform the polarization process in a direction in which + (plus) charges are induced to the side of the first electrode 41 which is the p-type semiconductor and − (minus) charges are induced to the side of the ferroelectric layer 42 which is the p-type semiconductor when viewed from a point of view of effective photoelectric conversion. Therefore, the low sensitivity mode is realized.

Since the PN junction 46 is formed between the ferroelectric layer 42 and the first electrode 41 in the above-described solid state imaging device, the solid state imaging element 44 is compatible with the ferroelectric property and the PN junction diode property, and thus it is possible to change the PN junction diode property by changing the polarization direction of the ferroelectric layer 42.

Accordingly, it is possible to adjust sensitivity according to the brightness of the imaging target by determining the polarization direction of the ferroelectric layer 42 based on the brightness information of the imaging target, and thus it is possible to enlarge the dynamic range. Therefore, it is possible to prevent positional displacement by merging the plurality of pieces of image information, and it is possible to provide a solid state imaging device which can acquire an image with high sensitivity.

EXAMPLE

First Example

Solution Preparation

A BLFMT precursor solution, which is used to form the ferroelectric layer 12, is prepared in the following order. First, propionic acid is measured using a beaker, and bismuth acetate, lanthanum acetate, iron acetate, manganese acetate, and tetraisopropoxide titanium are mixed at a molar ratio of 80:20:96:1:3. Subsequently, the BLFMT precursor solution is prepared by adjusting the mixture to 0.3 mol/L using propionic acid after heating and stirring on a hotplate at 140° C. for one hour.

Solid State Imaging Apparatus Manufacture

The silicon dioxide film is formed on the surface of the 6 inch silicon (Si) substrate 24 as the insulation layer 34 using thermal oxidation, and the first electrode 11 is formed on the silicon dioxide film by laminating aluminum titanium nitride, iridium, iridium oxide, and platinum.

The BLFMT precursor solution is coated on the first electrode 11 using a spin coat method by 1500 rpm. Subsequently, after the BLFMT precursor solution is heated on the hotplate for two minutes by 180° C., the BLFMT precursor solution is heated for three minutes at 350° C. After the coating process to the heating process are repeated four times, the BLFMT precursor solution is heated for five minutes at 650° C. in nitrogen using Rapid Thermal Annealing (RTA). The ferroelectric layer 12 is formed by repeating the series of processes are repeated two times.

The second electrode 13, which is formed of Indium oxide tin (ITO) is formed on the ferroelectric layer 12 using a metal through mask and the sputtering method. As described above, the solid state imaging element 14 is manufactured. With the manufactured solid state imaging element 14, the solid state imaging device 10 according to the first example is manufactured by a routine procedure.

First Comparative Example

A solid state imaging device according to a first comparative example is manufactured using the same method as in the first example except that platinum is used as the second electrode.

PN Junction Diode Property

With regard to the solid state imaging element which is mounted on the solid state imaging device according to the first example and the first comparative example, the relationship (J-E Curve) between a current density $J(\mu A/cm^2)$ and a voltage E(V) is acquired in a state in which outdoor light is shielded in air (moisture 40% to 50%) using "4140B" made by the Hewlett-Packard Company.

Figure 11:
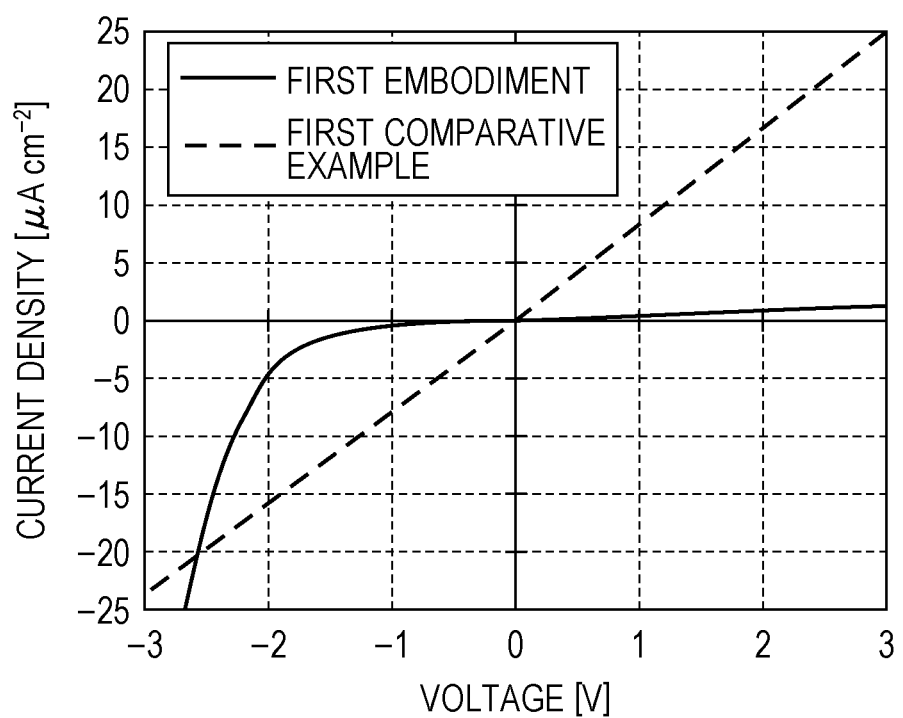
FIG. 11 is a graph illustrating the relationship between a current density (J) and a voltage (E).

FIG. 11 illustrates the J-E Curve. In the first comparative example which is expressed by a dotted line, an ohmic junction property in which a current density J is proportional to a voltage E is observed. In contrast, in the first example which is expressed by a solid line, the distinguishing property of a unique diode is observed in the PN junction in which currents easily flow in only a single direction, for example, a negative voltage direction. Further, in the first example, it is apparent that the ferroelectric layer 12 is the p-type semiconductor, and the second electrode 43, that is, the transparent electrode (ITO) is the n-type semiconductor based on the characteristics of the diode shown in FIG. 11.

In addition, the solid state imaging element 14 which is mounted in the first example is manufactured as the same as the solid state imaging element which is mounted in the first comparative example except for the second electrode 13. Therefore, it is understood that the PN junction diode property which is observed in the first example is attributable to the second electrode 13 which is the n-type semiconductor.

P-E Loop Measurement

With regard to the solid state imaging element which is mounted on the solid state imaging device according to the first example and the first comparative example, the relationship (P-E loop) between the polarization quantity P $(\mu C/cm^2)$ and the voltage E(V) is acquired by using "FCE-1A" made by TOYO corporation, using an electrode pattern in which $\phi=500$ μm, and applying a triangular waveform at a frequency of 1 kHz at room temperature.

Figure 12:
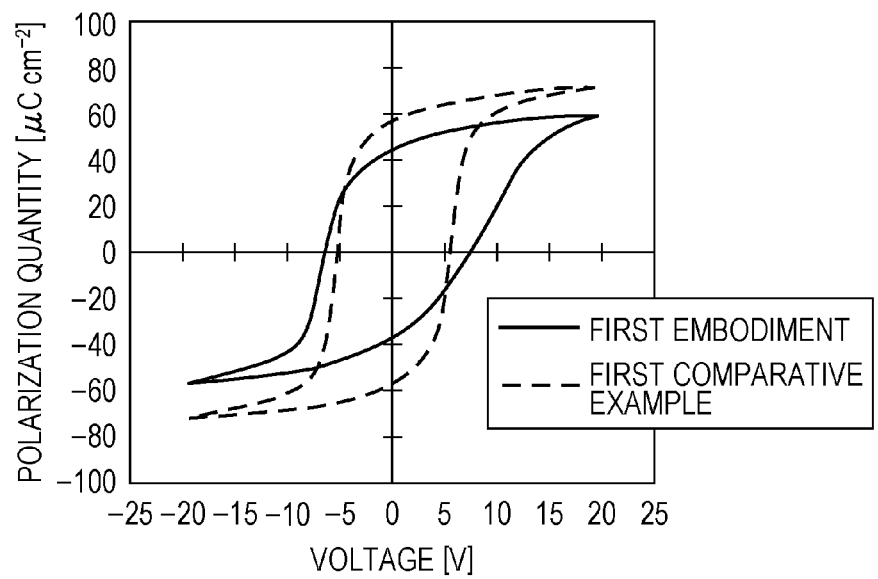
FIG. 12 is a graph illustrating the relationship between a polarization quantity (P) and the voltage (E).

FIG. 12 illustrates the P-E loop. Since both the first comparative example which is expressed by a dotted line and the first example which is expressed by a solid line show a hysteresis loop (hysteresis) which is characteristic of a ferroelectric substance, it is apparent that both are ferroelectric substances and that it is possible to maintain polarization which is generated by applying, for example, the polarization voltage.

However, in the first comparative example which is expressed by the dotted line, symmetric hysteresis is observed. In contrast, in the first example which is expressed by the solid line, asymmetric hysteresis is observed. The reason for this is that the first example has the PN junction diode property as described above, and thus electric properties vary between a positive voltage area and a negative voltage area. Based on the result, it is apparent that the ferroelectric layer 12 is compatible with the ferroelectric property and the PN junction diode property in the first example.

Photoelectric Conversion Property

With regard to the solid state imaging element 14 which is mounted in the first example, the PN junction diode property, particularly, the photoelectric conversion property is evaluated using "FCE-1A" made by TOYO corporation and "6514 electrometer" made by Keithley instruments. More specifically, the polarization process of the ferroelectric layer 12 is performed using "FCE-1A" and by applying an unipolar triangular waveform having +20 V or −20 V of a frequency of 1 kHz at a room temperature to an electrode pattern in which $\phi=500$ μm. Subsequently, photovoltaic currents are measured using a pico-amperemeter while repeating light on and light off of a fluorescent light under a potential of 2 mV (unavoidable circuit potential).

The measurement is performed on both cases, that is, when the ferroelectric layer 12 is polarized in a downward direction in which − (minus) charges are induced to the side of the ferroelectric layer 12 which is the p-type semiconductor and + (plus) charges are induced to the side of the second electrode 13 which is the n-type semiconductor and when the ferroelectric layer 12 is polarized in a upward direction in which + (plus) charges are induced to the side of the ferroelectric layer 12 which is the p-type semiconductor and − (minus) charges are induced to the side of the second electrode 13 which is the n-type semiconductor.

Figure 13:
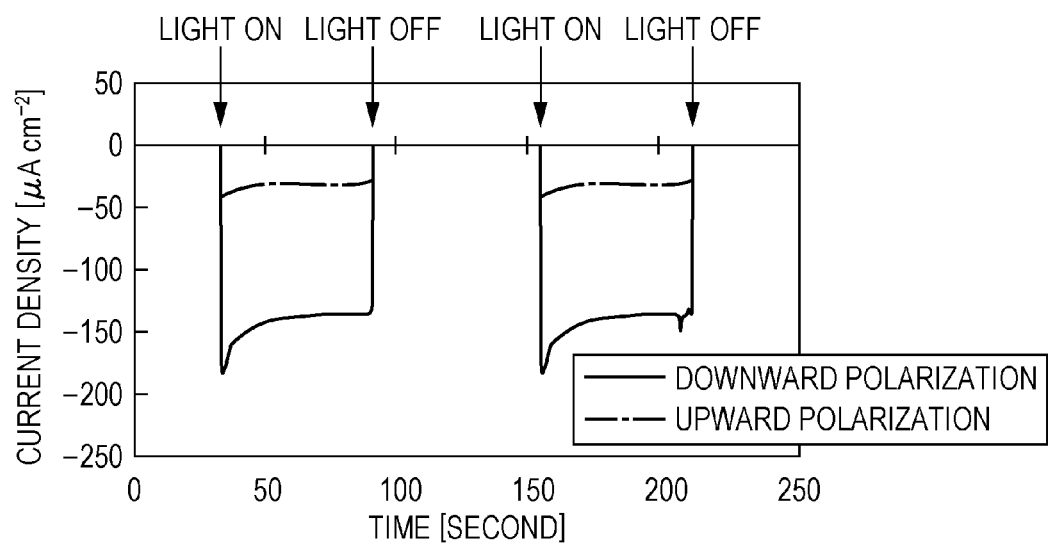
FIG. 13 is a graph illustrating the measurement of photovoltaic currents due to the irradiation with light.

FIG. 13 illustrates the photoelectric conversion property. As shown in the drawing, a photovoltaic current density is observed in the first example. Therefore, it is understood that radiated fluorescent light passes through the second electrode 13, which is transparent in a visible light area, and reaches the depletion layer 30, and thus an internal photoelectric effect is expressed.

In addition, as shown by a dashed line, photovoltaic currents, which can be acquired when the ferroelectric layer 12 is polarized in the upward direction, are −30 nA/cm². In contrast, as shown by a solid line, photovoltaic currents, which can be acquired when the ferroelectric layer 12 is polarized in the downward direction, are −133 nA/cm², that is, the absolute value thereof is approximately 4.4 times higher compared to the measurement results expressed by the dashed line.

Accordingly, it is understood that the area of the depletion layer 30 is enlarged or reduced by polarizing the ferroelectric layer 12 in the downward direction or the upward direction, and a difference is generated in the detected photovoltaic currents, and thus it is possible to determine the polarization direction based on the photovoltaic currents and it is possible to select the high sensitivity mode and the low sensitivity mode.

Another Embodiment

As above, although the embodiments of the invention have been described, the basic configuration thereof is not limited to the above description.

In the embodiment, the solid state imaging device 10 having a structure (surface irradiation structure) in which the second electrodes 13 and 43 which function as an upper electrode is the n-type semiconductor having transparency has been described as an example. However, light may touch the PN junction and the upward or downward direction of a light receiving surface is not restricted from a point of view of a photoelectric conversion function. For example, a structure (back surface irradiation structure) in which the n-type semiconductor which has transparency is used as a lower electrode, the substrate is formed such that the lower electrode is exposed, and then grinding or etching is performed may be used. Further, the connection state of various wirings or the like which are appropriately not shown in the drawing are not limited to the example of the first embodiment.

Further, it is possible to preferably use the ferroelectric layers 12 and 42 of the solid state imaging elements 14 and 44 which are mounted on the solid state imaging device 10 according to the embodiment for various optical elements. For example, when the ferroelectric layers 12 and 42 are formed as the p-type semiconductor, it is possible to control the carrier concentration of the first electrode 41 or the second electrode (n-type semiconductor) 13 which forms the PN junctions 16 and 46 between the ferroelectric layers 12 and 42 according to the polarization direction of the ferroelectric layer 12. As a result, it is possible to change the optical property according to the ferroelectric property of the ferroelectric layers 12 and 42.

An optical switch, a wavelength converter, an optical waveguide, a refractive index control element, an electron shutter mechanism, a half mirror, a frequency control filter (low-pass filter or a high-pass filter), a filter for blocking harmful rays such as infrared rays, an optical interference filter, an optical interferometer, an optical filter which uses an photonic crystal effect based on the formation of quantum dots, a thermo-optical conversion filter, or the like may be an example of the optical element which can be preferably used.

In addition, it is possible to preferably use the solid state imaging elements 14 and 44 which are mounted on the solid state imaging device 10 according to the embodiment as a ferroelectric substance element. A ferroelectric substance transistor (FeFET), a ferroelectric substance calculation circuit (FeLogic), a solid state imaging element, or the like may be an example of the ferroelectric substance element which can be preferably used.

In addition, since the solid state imaging elements 14 and 44 which are mounted on the solid state imaging device 10 according to the embodiment shows an excellent piezoelectric property, it is possible to preferably apply the solid state imaging elements 14 and 44 to piezoelectric elements. A liquid ejecting device, an ultrasonic motor, an ultrasonic transmitter, an ultrasonic detector, a vibration-type dust removal device, a piezoelectric transformer, an acceleration sensor, a pressure sensor, a piezoelectric speaker, a piezoelectric pump, a pressure-electricity conversion device, or the like may be an example of the piezoelectric element which can be preferably used.

Further, since the solid state imaging elements 14 and 44 which are mounted on the solid state imaging device 10 according to the embodiment shows an excellent pyroelectric property, it is possible to preferably apply the solid state imaging elements 14 and 44 to pyroelectric elements. A temperature detector, a living body detector, an infrared detector, a terahertz detector, a thermo-electricity converter, or the like may be an example of the pyroelectric element which can be preferably used.

The invention claimed is:
1. A solid state imaging device comprising:
 a plurality of solid state imaging elements in each of which a first electrode, a ferroelectric layer, and a second electrode which is a transparent electrode are laminated, and a PN junction is formed between the ferroelectric layer and the first electrode or the second electrode;
 a control section that acquires brightness information of an imaging target, and determines whether each of solid state imaging elements is set to operate in a high sensitivity mode or a low sensitivity mode based on the acquired brightness information; and
 a circuit that applies a voltage to the solid state imaging element based on the determination, and sets the solid state imaging element to operate in the low sensitivity mode or the high sensitivity mode,
 wherein a photovoltaic current from the solid state imaging element which is set to operate in the high sensitivity mode or the low sensitivity mode is detected based on each mode, and an image is acquired based on the detection result; and wherein a polarization direction of each of the solid state imaging elements is controlled such that a depletion layer according to the PN junction is enlarged in the high sensitivity mode, and the depletion layer according to the PN junction is reduced in the low sensitivity mode.

2. The solid state imaging device according to claim 1, wherein the control section compares the brightness information with a predetermined threshold, determines the polarization direction or a voltage value, which is in the low sensitivity mode, with regard to the solid state imaging element in an area in which the brightness information is greater than the threshold, determines the polarization direction or a voltage value, which is in the high sensitivity mode, with regard to the solid state imaging element in an area in which the brightness information is equal to or less than the threshold, and controls each of the solid state imaging elements to operate in the high sensitivity mode or the low sensitivity mode based on the determination.

3. The solid state imaging device according to claim 2, wherein the ferroelectric layer is a p-type semiconductor.

4. The solid state imaging device according to claim 2, wherein the ferroelectric layer includes bismuth (Bi) and iron (Fe).

5. The solid state imaging device according to claim 2, wherein the ferroelectric layer includes at least one type which is selected from a group including lanthanum (La), manganese (Mn), and titanium (Ti).

6. The solid state imaging device according to claim 1, wherein the polarization direction of the plurality of solid state imaging elements is reset in advance such that all of the plurality of solid state imaging elements are in the high sensitivity mode or the low sensitivity mode before setting the solid state imaging element to operate in the high sensitivity mode or the low sensitivity mode.

7. The solid state imaging device according to claim 1, wherein the ferroelectric layer is a p-type semiconductor.

8. The solid state imaging device according to claim 1, wherein the ferroelectric layer includes bismuth (Bi) and iron (Fe).

9. The solid state imaging device according to claim 1, wherein the ferroelectric layer includes at least one type which is selected from a group including lanthanum (La), manganese (Mn), and titanium (Ti).

10. An image acquisition method using a solid state imaging device which includes a plurality of solid state imaging elements in each of which a first electrode, a ferroelectric layer, and a second electrode which is a transparent electrode are laminated, and a PN junction is formed between the ferroelectric layer and the first electrode or the second electrode, the image acquisition method comprising:

acquiring brightness information of an imaging target;

determining whether each of solid state imaging elements is set to operate in a high sensitivity mode or a low sensitivity mode based on the brightness information;

setting the solid state imaging element to operate in the low sensitivity mode or the high sensitivity mode based on the determination;

detecting a photovoltaic current from the solid state imaging element which is set to operate in the high sensitivity mode or the low sensitivity mode based on each mode; and acquiring an image based on the detection result, wherein a polarization direction of each of the solid state imaging elements is controlled such that a depletion layer according to the PN junction is enlarged in the high sensitivity mode, and the depletion layer according to the PN junction is reduced in the low sensitivity mode.

* * * * *